US012666902B2

(12) United States Patent
Zhang et al.

(10) Patent No.: US 12,666,902 B2
(45) Date of Patent: Jun. 23, 2026

(54) LASER CUTTING WITH ELECTRON REMOVAL

(71) Applicant: Sandisk Technologies, Inc., Milpitas, CA (US)

(72) Inventors: Cong Zhang, Shanghai (CN); Hope Chiu, Shanghai (CN); Yiqin Huang, Shanghai (CN); Guocheng Zhong, Shanghai (CN); Weiting Jiang, Shanghai (CN); Dongpeng Xue, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 948 days.

(21) Appl. No.: 17/837,175

(22) Filed: Jun. 10, 2022

(65) Prior Publication Data
US 2023/0411179 A1    Dec. 21, 2023

(51) Int. Cl.
| | |
|---|---|
| *H10P 72/00* | (2026.01) |
| *B23K 26/38* | (2014.01) |
| *H10P 34/42* | (2026.01) |
| *H10P 54/00* | (2026.01) |

(52) U.S. Cl.
CPC .......... *H10P 72/0428* (2026.01); *B23K 26/38* (2013.01); *H10P 34/42* (2026.01); *H10P 54/00* (2026.01)

(58) Field of Classification Search
CPC ............ B23K 2101/40; B23K 2103/56; B23K 26/1224; B23K 26/123; B23K 26/127; B23K 26/142; B23K 26/38; B23K 26/402; B23K 26/702; H01L 21/268; H01L 21/67092; H01L 21/78; H01L 21/67
See application file for complete search history.

(56) References Cited

U.S. PATENT DOCUMENTS

| | | | | |
|---|---|---|---|---|
| 5,622,567 | A | * | 4/1997 | Kojima ............... C23C 14/3471 |
| | | | | 427/596 |
| 10,304,665 | B2 | * | 5/2019 | Gorokhovsky ... H01J 37/32715 |
| 11,905,588 | B2 | * | 2/2024 | Mahjouri-Samani ........................ |
| | | | | B23K 26/144 |
| 2008/0241425 | A1 | | 10/2008 | Li et al. |
| 2013/0326870 | A1 | | 12/2013 | Schmidt et al. |

FOREIGN PATENT DOCUMENTS

| | | |
|---|---|---|
| JP | 110242072 A | 9/1998 |
| JP | 2004188451 A | 7/2004 |
| WO | 2010006067 A2 | 1/2010 |

* cited by examiner

*Primary Examiner* — Edward F Landrum
*Assistant Examiner* — Adam M Eckardt
(74) *Attorney, Agent, or Firm* — PATTERSON + SHERIDAN, LLP

(57)    ABSTRACT

A laser cutting process for ensuring a plasma plume or cloud that forms during a substrate cutting process does not lead to undesired re-deposition of material onto the substrate. At least one electrode is biased to draw the electrons of the plasma plume or cloud towards the electrode and away from the substrate. A vacuum port and/or a blower may be strategically located to ensure gas flow away from the substrate and hence, directing of the electrons away from the substrate. In so doing, material re-deposition is less likely to occur.

20 Claims, 13 Drawing Sheets

700

LASER CUTTING WITH ELECTRON REMOVAL

BACKGROUND OF THE DISCLOSURE

Field of the Disclosure

Embodiments of the present disclosure generally relate to a laser cutting method that reduces silicon buildup and increase the laser cut efficiency.

Description of the Related Art

During a laser cutting process, a plasma plume or cloud is formed by laser ablation. The plasma plume is one of the side effects of laser cutting. Laser ablation process efficiency is typically measured in ablation depth per pulse, known as ablation rate. The ablation rate is a function of the optical and thermal properties of the material being cut and the laser beam characteristics. The laser beam characteristics may include laser wavelength, pulse width, optical spot size, beam quality, pulse energy, pulse repetition frequency (PRF), and number of pulses overlapped.

For a homogeneous material, when laser wavelength and pulse width are fixed, the ablation rate is a function of laser fluence (or intensity) that approximately follows a logistic curve shown in FIG. 1A. In Zone 1, material modification or degradation occurs. In Zone 2, the ablation rate is low, but the processing quality is good. In Zone 3, the ablation rate dramatically increases with the increase in laser fluence and may in fact be saturated while the processing quality degrades significantly. Additionally, the dimensions of the ablation generated features is less controllable in terms or ablation morphology such as kerf smoothness, severity of chipping or cracking, debris size and distribution, and heat affected zone (HAZ) dimension.

The transition from Zone 2 to Zone 3 can be explained by the energy transportation process. The density of free electrons increases with the increase of fluence. As the electron density reaches a critical value of $10^{18}$ cm$^3$, collisions between the electrons begins to dominate other relaxation processes and behave collectively as plasma which results in slower energy transfer from electrons to lattice. Energy transfer to the bulk material is governed by thermal diffusion. The laser intensity is influenced by plasma absorption as shown in FIG. 1B.

The laser intensity is influenced by plasma absorption causes cutting energy requirement increased. Also, Nucleation of silicon atoms from a silicon substrate that is cut will finally accumulate on the target surface, which may impact the cutting quality. Therefore, there is a need in the art for improved laser cutting.

SUMMARY OF THE DISCLOSURE

The present disclosure generally relates to ensuring a plasma plume or cloud that forms during a laser cutting process does not lead to undesired re-deposition of material onto the substrate. At least one electrode is biased to draw the electrons of the plasma plume or cloud towards the electrode and away from the substrate. A vacuum port and/or a blower may be strategically located to ensure proper gas flow away from the substrate and hence, directing of the electrons away from the substrate. In so doing, material re-deposition is less likely to occur.

In one embodiment, a processing chamber comprises: a substrate support having a surface upon which a hypothetical substrate is to be disposed during processing; a laser source; a first electrode coupled to a power source; and a second electrode coupled to ground, wherein the first electrode and the second electrode are disposed in the processing chamber such that the hypothetical substrate will be disposed between the first electrode and the second electrode, wherein a center of the first electrode is linearly aligned with at least a portion of the second electrode and the hypothetical substrate.

In another embodiment, a processing chamber comprises: a substrate support configured to support a hypothetical substrate; a laser source; and means for directing electrons emitted from the hypothetical substrate away from the hypothetical substrate, wherein the means for directing directs the electrons in a predetermined direction.

In another embodiment, a method comprises: disposing a substrate in a processing chamber on a surface of a substrate support; laser cutting the substrate; and directing electrons emitted during the laser cutting to a first electrode disposed in the processing chamber, wherein the directing comprises applying a bias to the first electrode and maintaining a second electrode at ground, wherein the second electrode is opposite to the first electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments.

Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to ensuring a plasma plume or cloud that forms during a laser cutting process does not lead to undesired re-deposition of material onto the substrate. At least one electrode is biased to draw the electrons of the plasma plume or cloud towards the electrode and away from the substrate. A vacuum port and/or a blower may be strategically located to ensure proper gas flow away from the substrate and hence, directing of the electrons away from the substrate. In so doing, material re-deposition is less likely to occur.

As discussed herein, an electric field applied during a laser cutting operation is beneficial. Once the plasma plume or cloud is formed, the electrons in the plasma can be removed from the laser cut cavities or trenches to reduce the electron density as well as atom accumulation on surfaces of the substrate. Depending upon the desired cut depth and width for the laser cutting, the electric field angle can be adjusted for better electron removal from a deeper cavity and hence reduce the risk of atom accumulation either on the substrate or the laser source. The electric field may be supplemented with a vacuum drawing the gas within the chamber towards the electrode or a blower pushing the gas towards the electrode. The vacuum or blower may be beneficial for removal of some particles or nucleation of silicon atoms that cannot be removed through electric field.

Figure 1A:
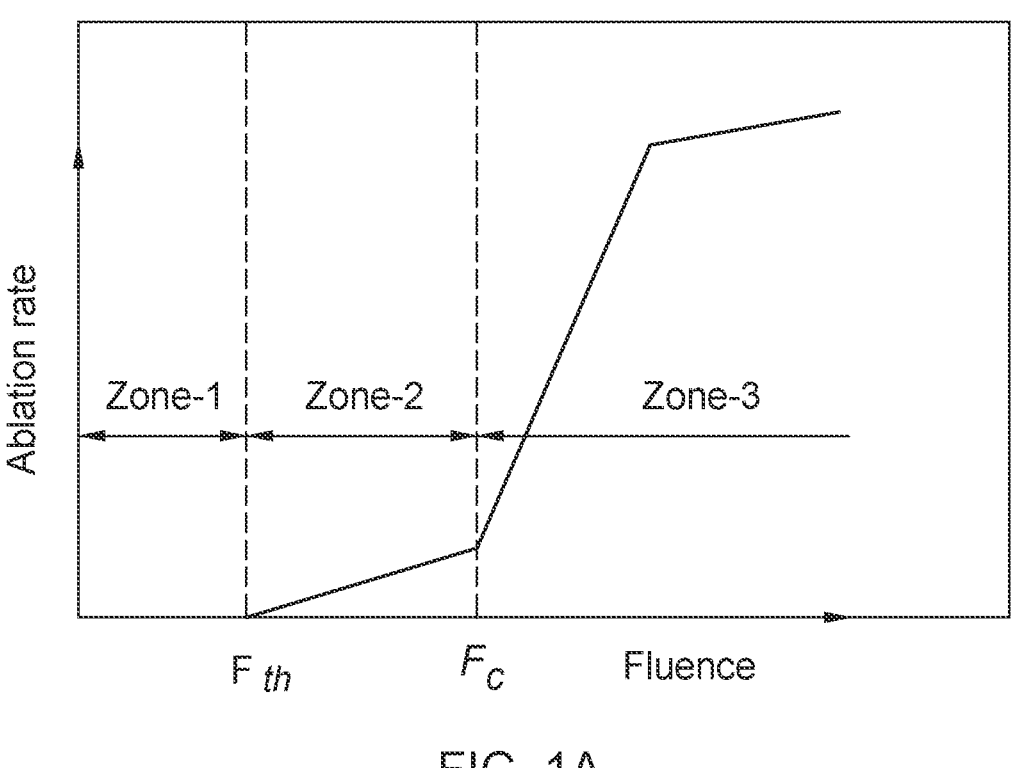
FIG. 1A is a graph illustrating the logistic curve for ablation rate.
Figure 1B:
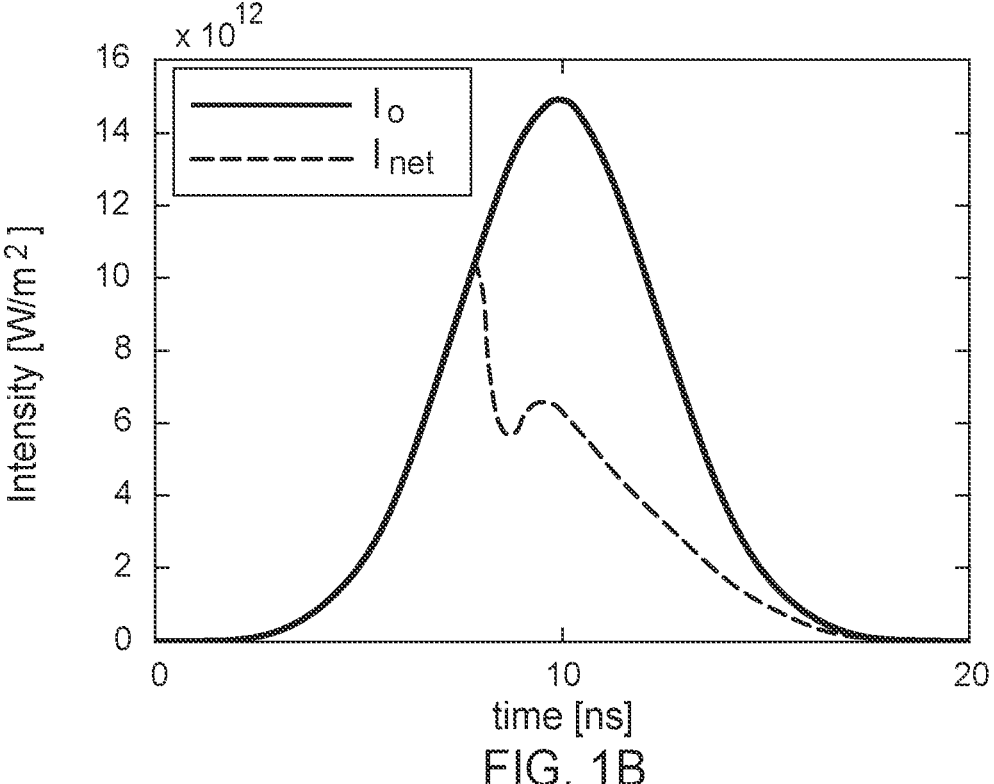
FIG. 1B is a graph illustrating expected laser intensity and net laser intensity.
Figure 2A:
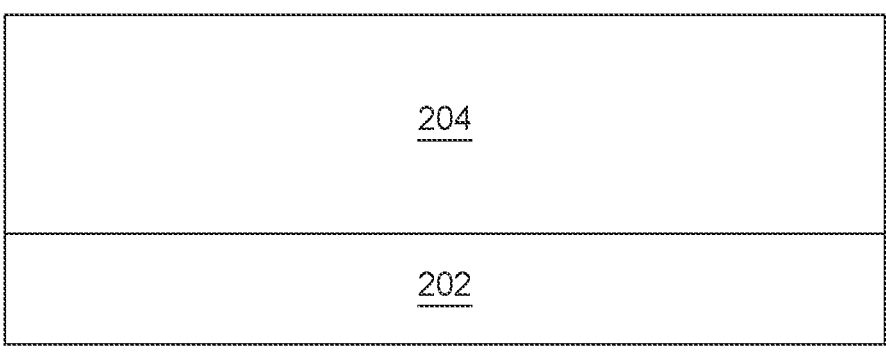
FIGS. 2A-2C are schematic illustrations of a silicon wafer at various stages of laser cutting.
Figure 2B:
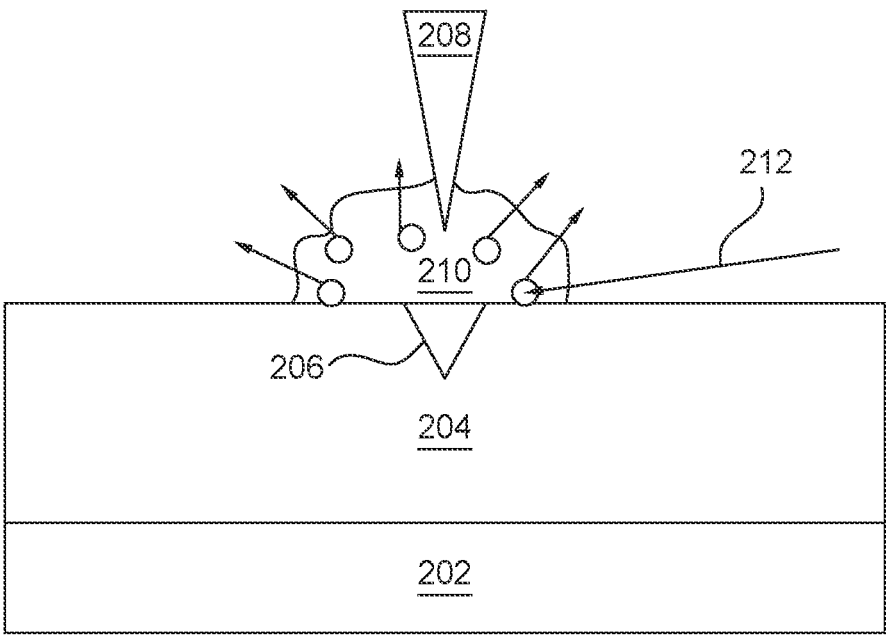
Figure 2C:
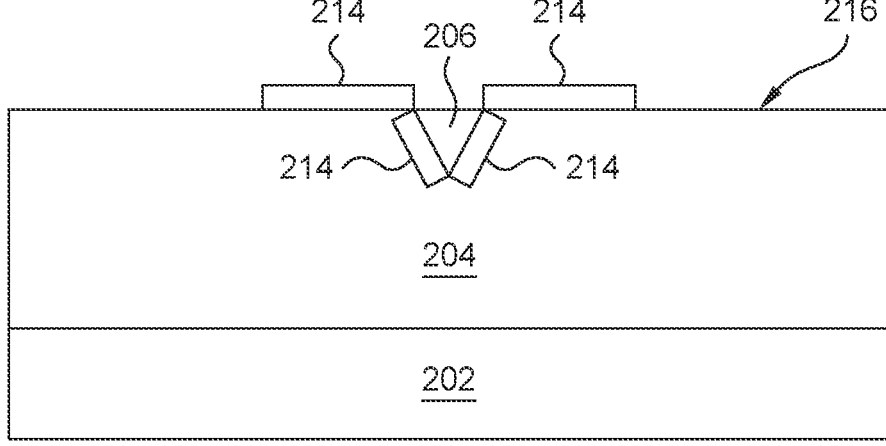

FIGS. 2A-2C are schematic illustrations of a silicon wafer 204 at various stages of laser cutting. The silicon wafer 204 is disposed on a laser cut tape 202 as shown in FIG. 2A, but it is to be understood that the silicon wafer 204 may be a stand-alone substrate without the tape 202. FIG. 2B illustrates a laser 208 cutting the trench 206 into the silicon wafer 204 and the resulting plasma plume 210 containing electrons 212. Following the cutting process, silicon 214 has undesirably re-deposited onto the silicon wafer. The silicon 214 is shown de-deposited onto the walls of the trench 206 as well as on the top surface 216 of the silicon wafer 204 near the trench 206.

Figure 3A:
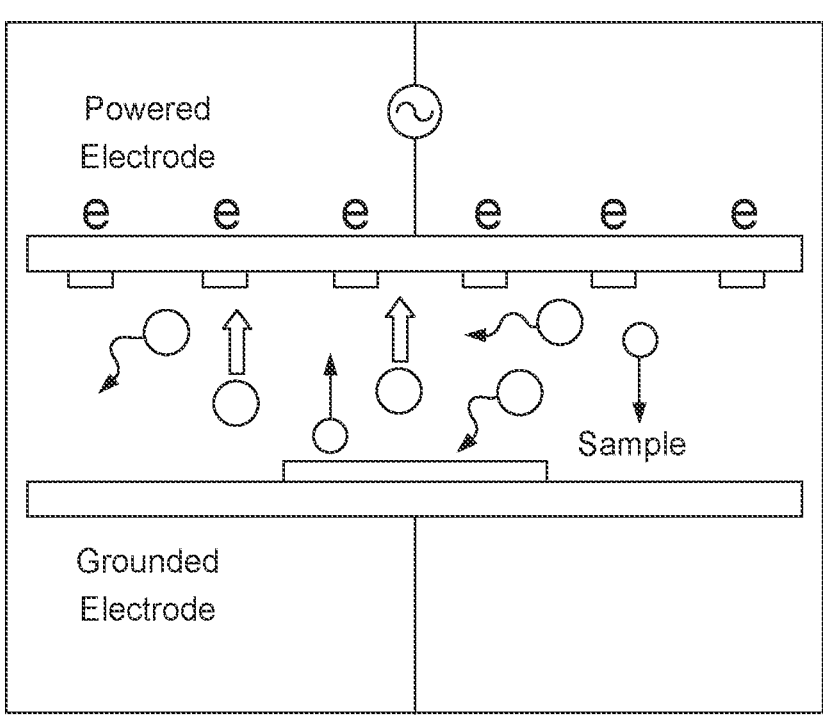
FIGS. 3A and 3B are schematic illustrations of electrode impacts upon plasma fields.
Figure 3B:
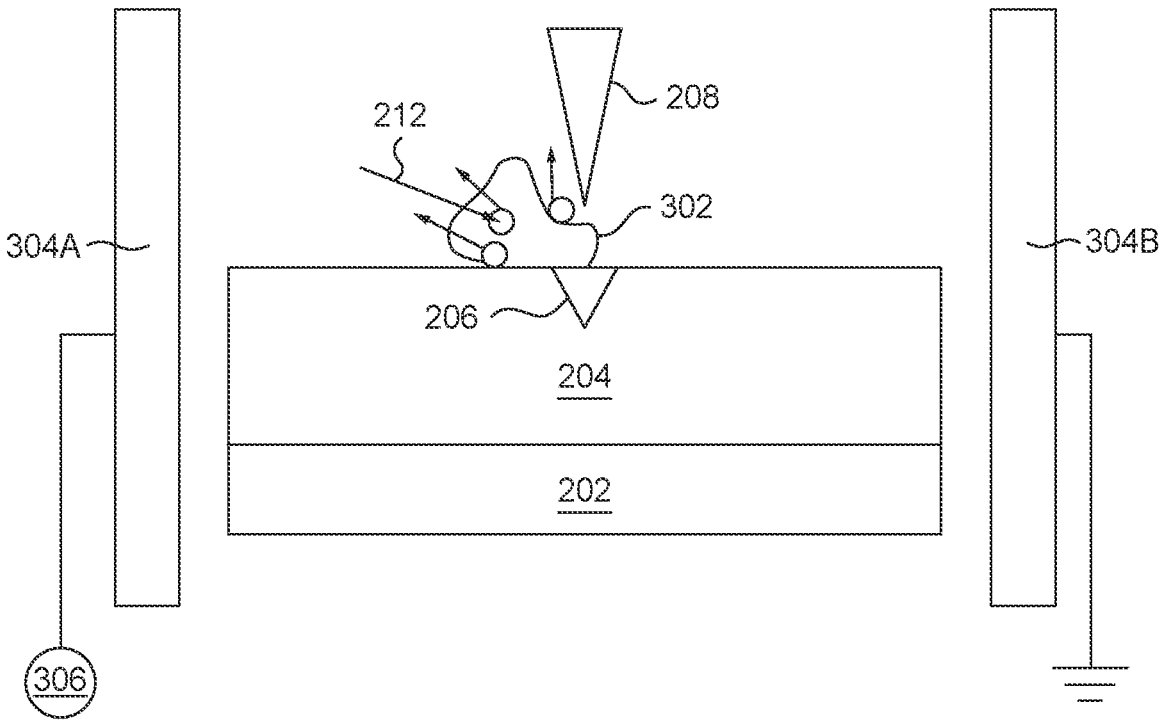

FIGS. 3A and 3B are schematic illustrations of electrode impacts upon plasma fields. FIG. 3A illustrates a high level overview of a power electrode opposite a grounded electrode with a substrate disposed on the grounded electrode. The electrons in the plasma are attracted to the powered electrode.

FIG. 3B illustrates a system in which a first electrode 304A is disposed adjacent the silicon wafer 204. The first electrode 304A is coupled to a power source 306. Similarly, a second electrode 304B is also disposed adjacent the silicon wafer 204, but the second electrode 304B is coupled to ground. Hence, the electrons 212 are drawn to the first electrode 304A during the laser cutting processing and the plasma plume 302 has shifted towards the first electrode 304A and away from the second electrode 304B as opposed to the plasma plume 210 being generally evenly distributed as shown in FIG. 2B.

Figure 4A:
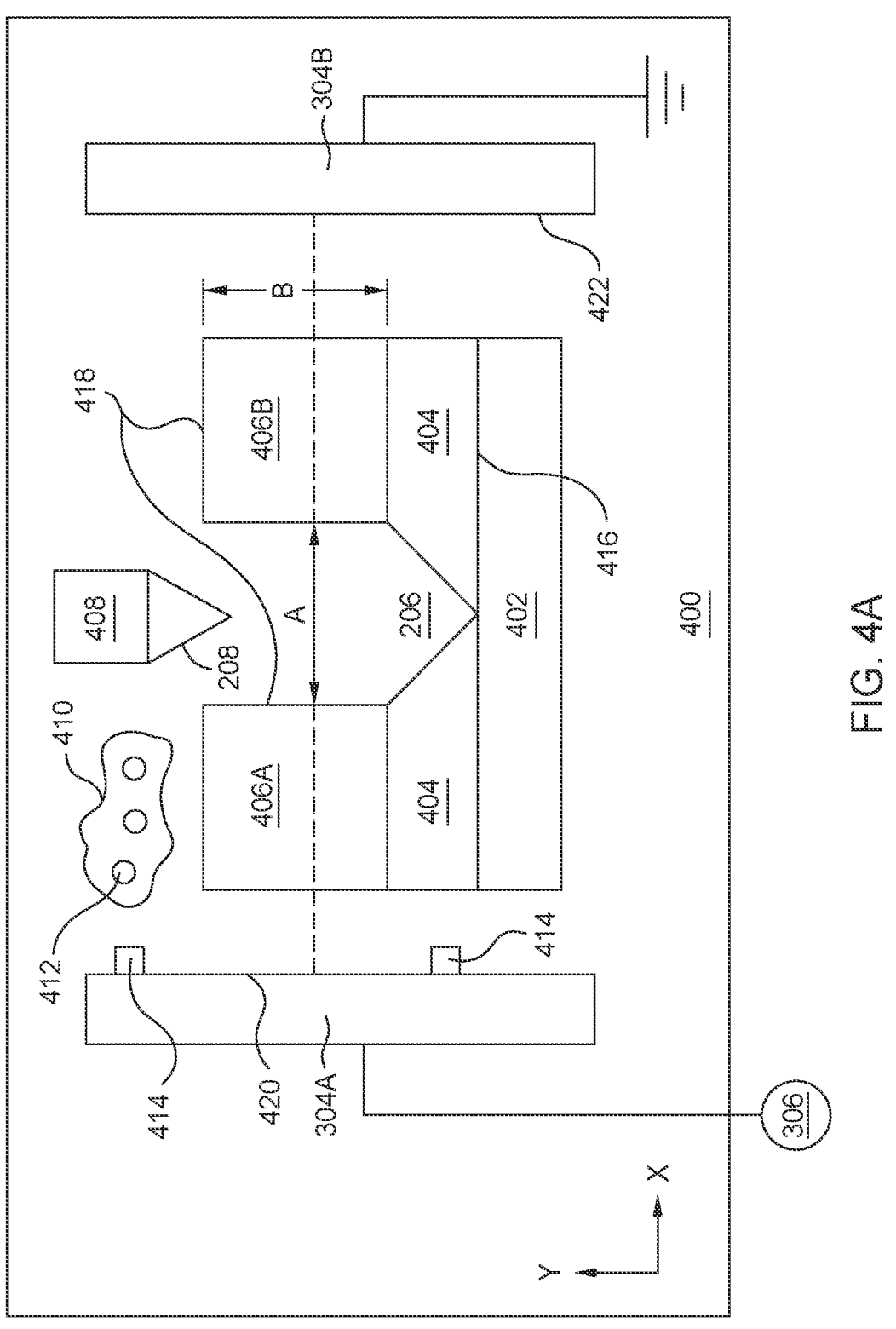
FIGS. 4A-4C are schematic illustrations of electrode orientation relative to substrate location in a laser cutting chamber according to various embodiments.
Figure 4B:
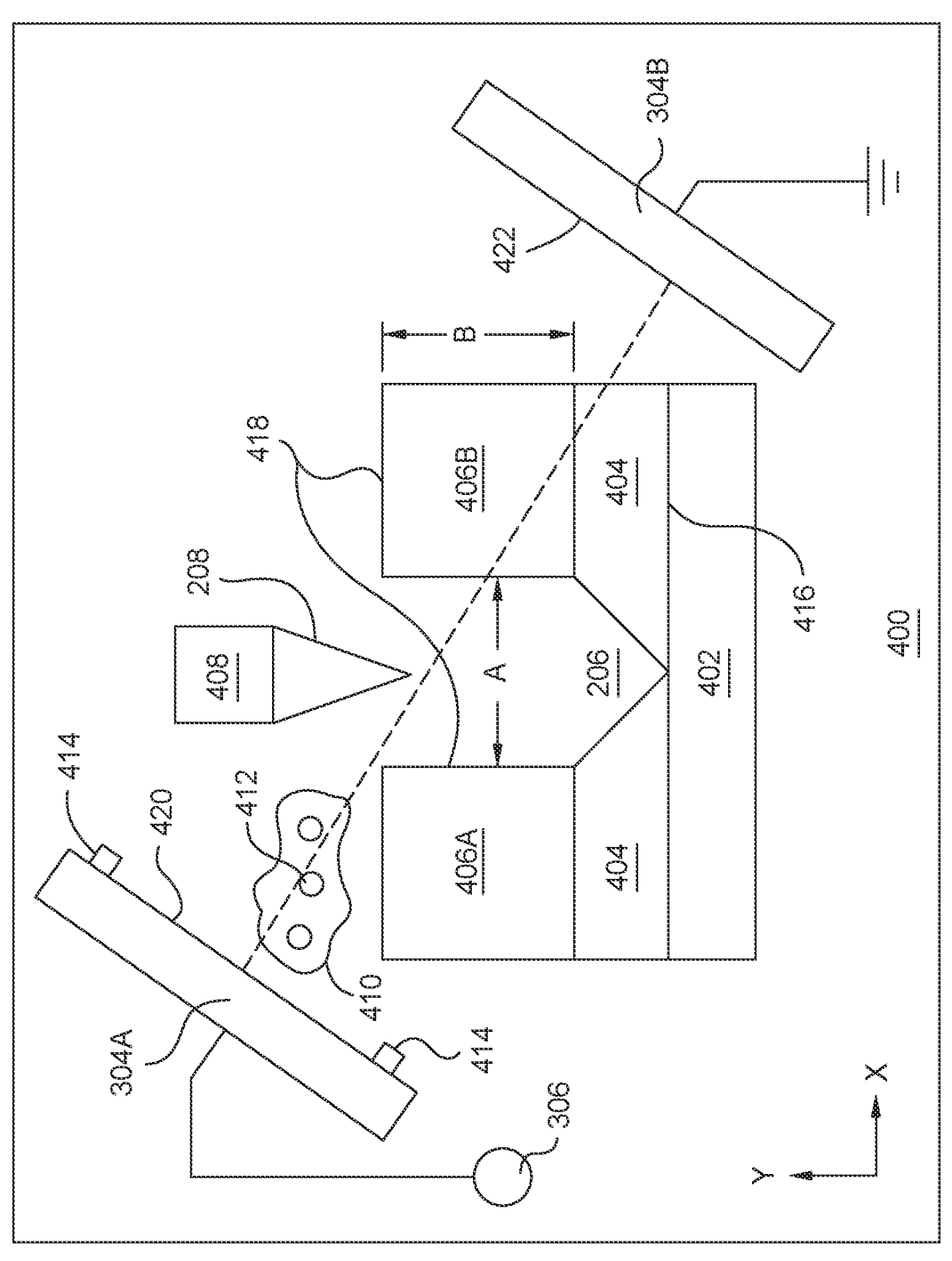
Figure 4C:
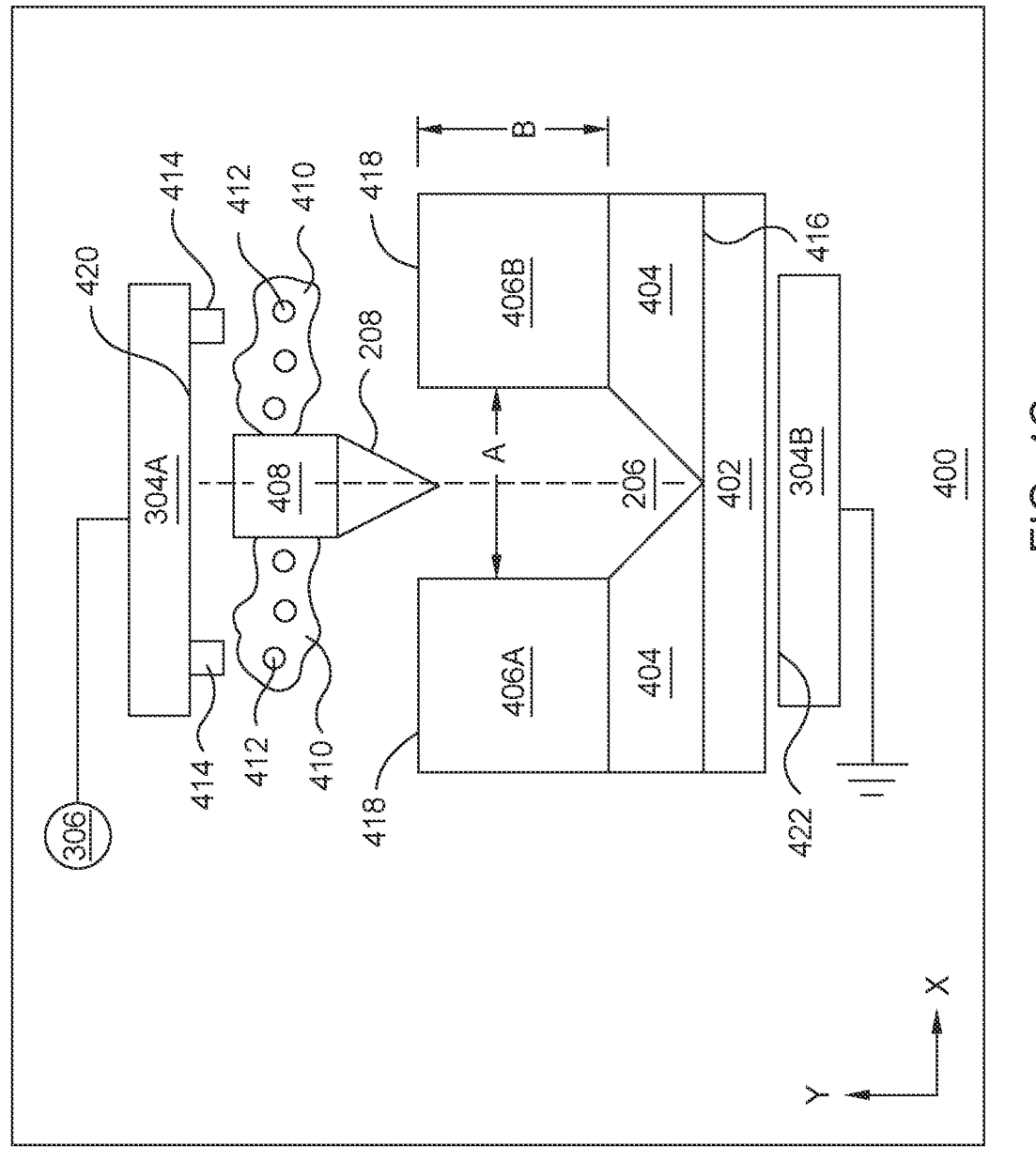

FIGS. 4A-4C are schematic illustrations of electrode orientation relative to substrate location in a laser cutting chamber 400 according to various embodiments. The chamber 400 includes the first electrode 304A and the second electrode 304B where the second electrode 304B is coupled to ground and the first electrode 304A is coupled to a power source 306. In one embodiment, the power source 306 may be DC. In yet another embodiment, the power source 306 may be pulsed DC. In still another embodiment, the power source 306 may be AC.

The chamber 400 includes a substrate support 402 having an upper surface 416 upon which the silicon wafer is disposed. The silicon wafer includes a laser cut tape 404 and silicon portions 406A, 406B through which the trench 206 has been cut by the laser 208 emitted from the laser source 408. The trench has a width "A" of between about 10 μm and about 20 μm and a height "B" of between about 20 μm and about 30 μm. As shown in FIG. 4A, the plasma 410 having electrons 412 is drawn towards the biased first electrode 304A. One or more electron density sensors 414 are disposed on the first electrode 304A to measure the electron density of the plasma 410.

The silicon wafer, and in particular the silicon portions 406A, 406B are disposed between the first electrode 304A and the second electrode 304B. A hypothetical line, shown as a dashed line, drawn from the center of the first electrode 304A extends through the silicon wafer and intersects at least a portion of the second electrode 304B, and in one embodiment, intersects the center of the second electrode 304B. Furthermore, the surface 420 of the first electrode 304A that faces the silicon portion 406A of the silicon wafer is substantially perpendicular to the surface 416 of the substrate support 402. Additionally, the surface 422 of the second electrode 304B that faces the silicon portion 406B of the silicon wafer is substantially perpendicular to the surface 416 of the substrate support 402. Hence, in the embodiment shown in FIG. 4A, surfaces 420, 422 are substantially parallel to one another. Because the surfaces 420, 422 are substantially perpendicular to the surface 416, the surfaces 420, 422 are at an angle of about degrees relative to the surface 416 of the substrate support 402. Due to the angle between the surface 420 and surface 416, the power source 406 may be more beneficial as an AC or pulsed DC power source. More specifically, when surface 420 is at an angle of between 45 degrees and 90 degrees relative to the surface 416, AC or pulsed DC may be beneficial as the power source 406.

As can be seen from FIG. 4A, at least some of the electrons 412 are drawn towards the first electrode 304A due to the bias applied to the first electrode 304A. It is to be noted that the electrons are well known to be negatively charged. Hence, the bias applied to the first electrode 304A is positive. In so doing, fewer electrons remain in the trench 206 or at the top surface 418 of the silicon portions 406A, 406B and hence, less silicon re-deposits thereon. Additionally, less silicon re-deposits on the laser source 408. With less re-deposition of silicon, the laser source 408 may still properly function, fewer laser passes are necessary to cut the silicon wafer, and better quality products result. The first electrode 304A, being biased, reduces the electron density which therefore increases the laser cutting speed for more effective and efficient laser cutting.

FIG. 4B is similar to FIG. 4A, except that the location of both the first electrode 304A and the second electrode 304B has changed. In the embodiment shown in FIG. 4B, the surface 420 of the first electrode 304A is now at an angle of 45 degrees relative to the surface 416 of the substrate support 402. The angle is based upon the cutting depth (i.e., height "B") of the silicon wafer.

The larger the depth, the smaller the angle. Stated another way, the deeper the trench 206, the more the angle approaches 0 degrees so that the surfaces 416, 420 are parallel. In fact, FIG. 4C exemplifies the situation where the angle is 0 degrees. Generally, at angles of between about 0 degrees and about 45 degrees, the power source 306 is DC. Between angles of about 45 degrees and about 90 degrees, the power source 306 is pulsed DC or AC. It is contemplated that the electrodes 304A, 304B may be movable during the laser cutting operation to ensure the maximum amount of electron attraction to the first electrode 304A.

Figure 5A:
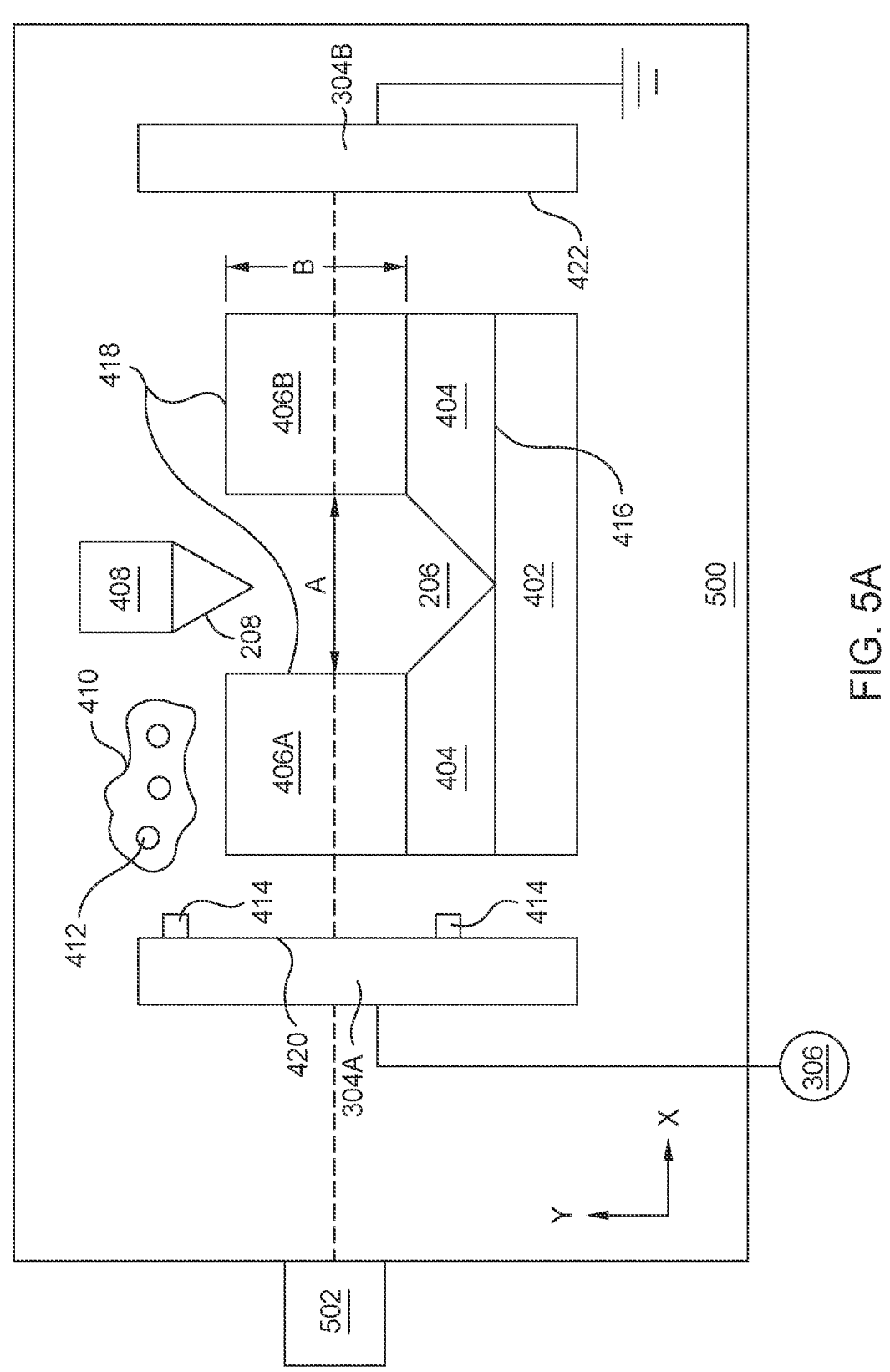
FIGS. 5A-5C are schematic illustrations of electrode and vacuum port orientation relative to substrate location in a laser cutting chamber according to various embodiments.
Figure 5B:
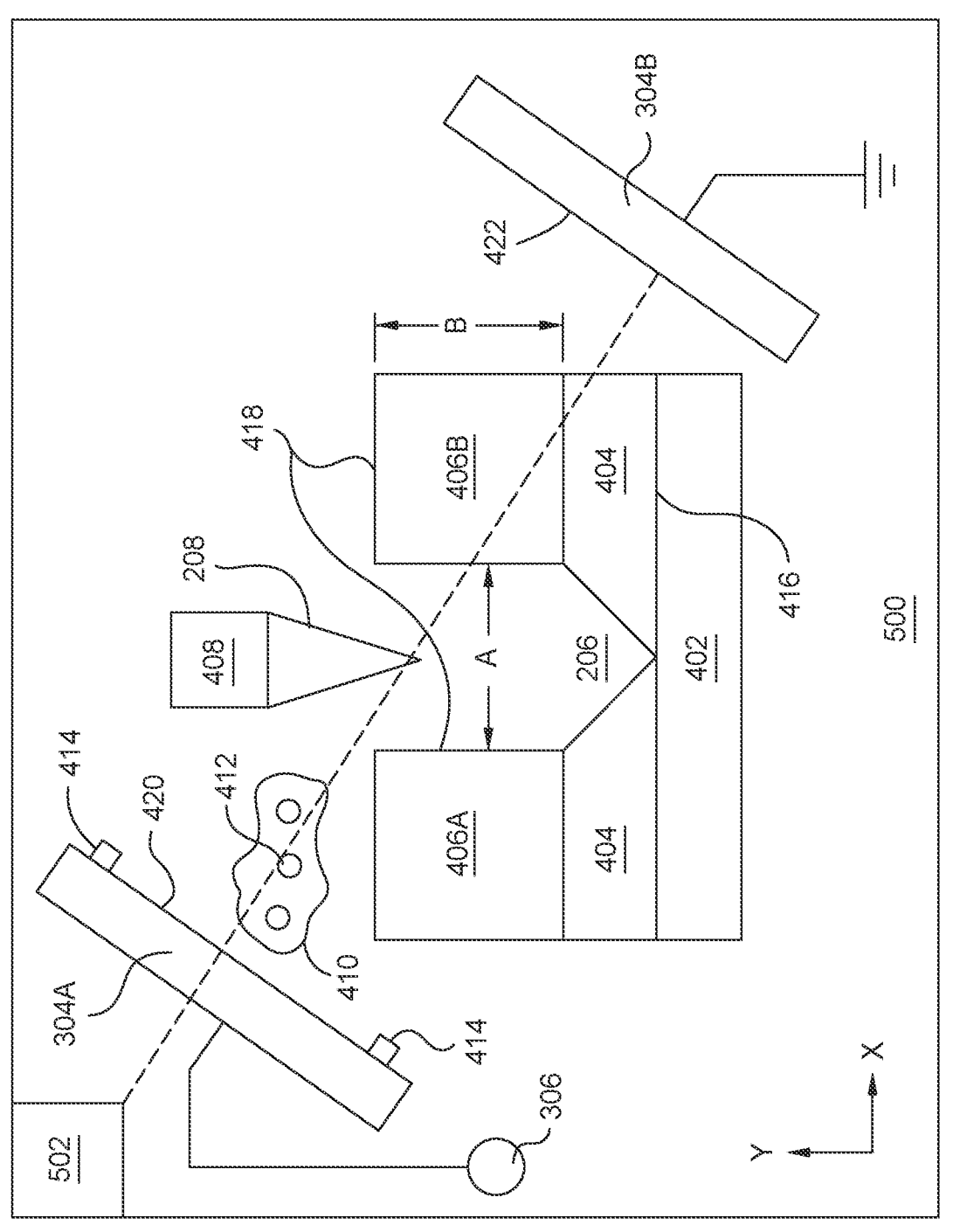
Figure 5C:
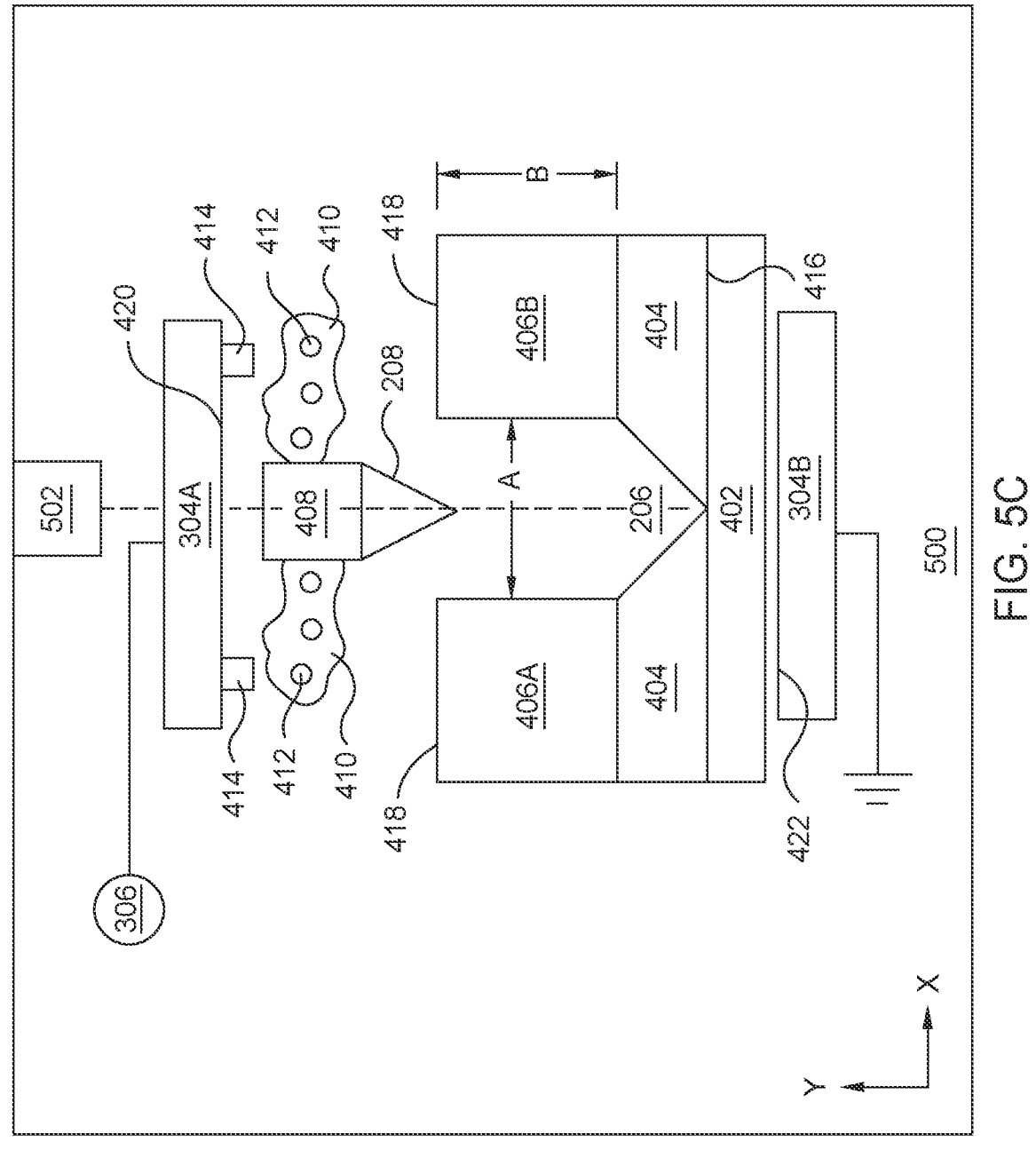

FIGS. 5A-5C are schematic illustrations of electrode and vacuum port orientation relative to substrate location in a laser cutting chamber 500 according to various embodiments. FIGS. 5A-5C are identical to FIGS. 4A-4C except that a vacuum port 502 has been added to FIGS. 5A-5C. The vacuum port 502 is a location where either a vacuum pump is disposed or an opening in the chamber 500 through which the chamber 500 is evacuated by a vacuum pump disposed outside of the chamber body. The vacuum port 502 is strategically located to be aligned with the first electrode 304A such that the vacuum is drawn towards the first electrode 304A. In so doing, the gas being drawn out of the chamber 500 will be drawn out of the trench 206 as will, ideally, the electrons 412. FIG. 5A shows the vacuum port 502 and the surface 420 of the first electrode 304A disposed at about 90 degrees from the surface 416 of the substrate support 402. FIG. 5B shows the vacuum port 502 and the surface 420 of the first electrode 304A disposed at about 45 degrees from the surface 416 of the substrate support 402. FIG. 5C shows the vacuum port 502 and the surface 420 of the first electrode 304A disposed at about 0 degrees from the surface 416 of the substrate support 402. It is to be understood that while the vacuum port 502 is shown to be aligned with the first electrode 304A, it is contemplated that the vacuum port 502 may be at other locations as well so long as the vacuum port 502 functions to draw electrons out of the trench 206 and away from the surface 418. It is also contemplated that the chamber 500 will be drawn to a vacuum level of −20 kPa to about −40 kPa.

Figure 6A:
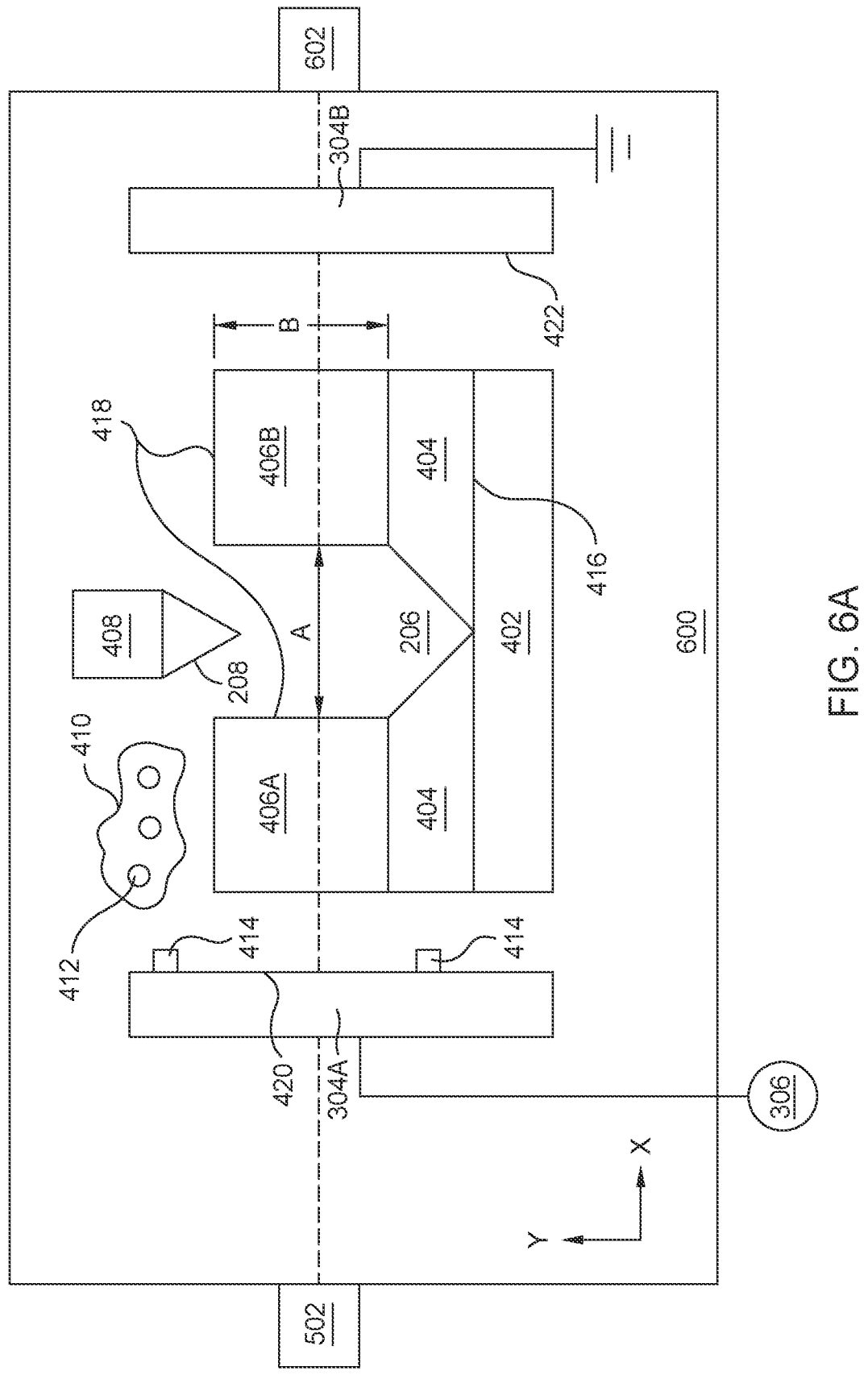
FIGS. 6A-6C are schematic illustrations of electrode, vacuum port, and blower orientation relative to substrate location in a laser cutting chamber according to various embodiments.
Figure 6B:
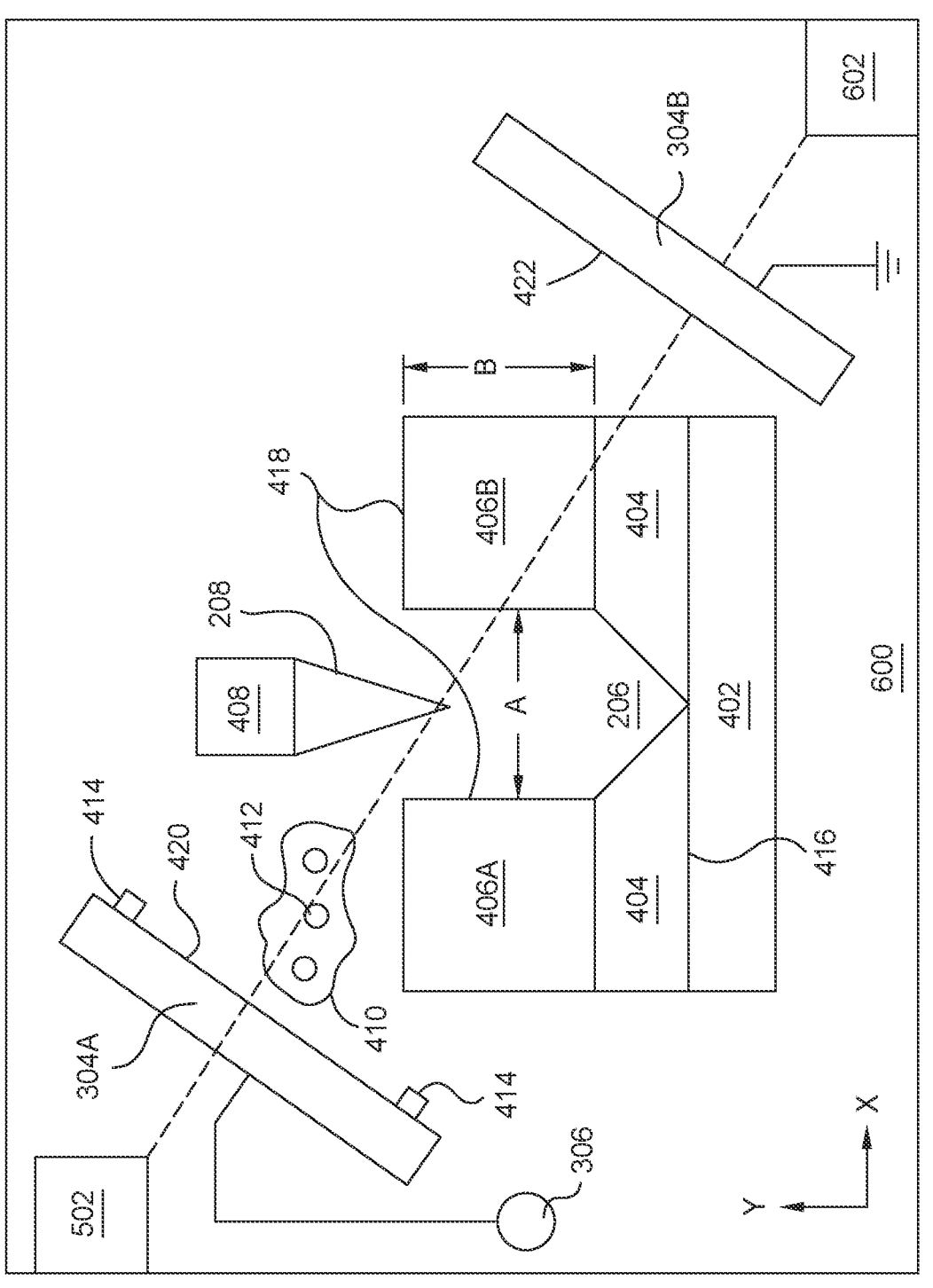
Figure 6C:
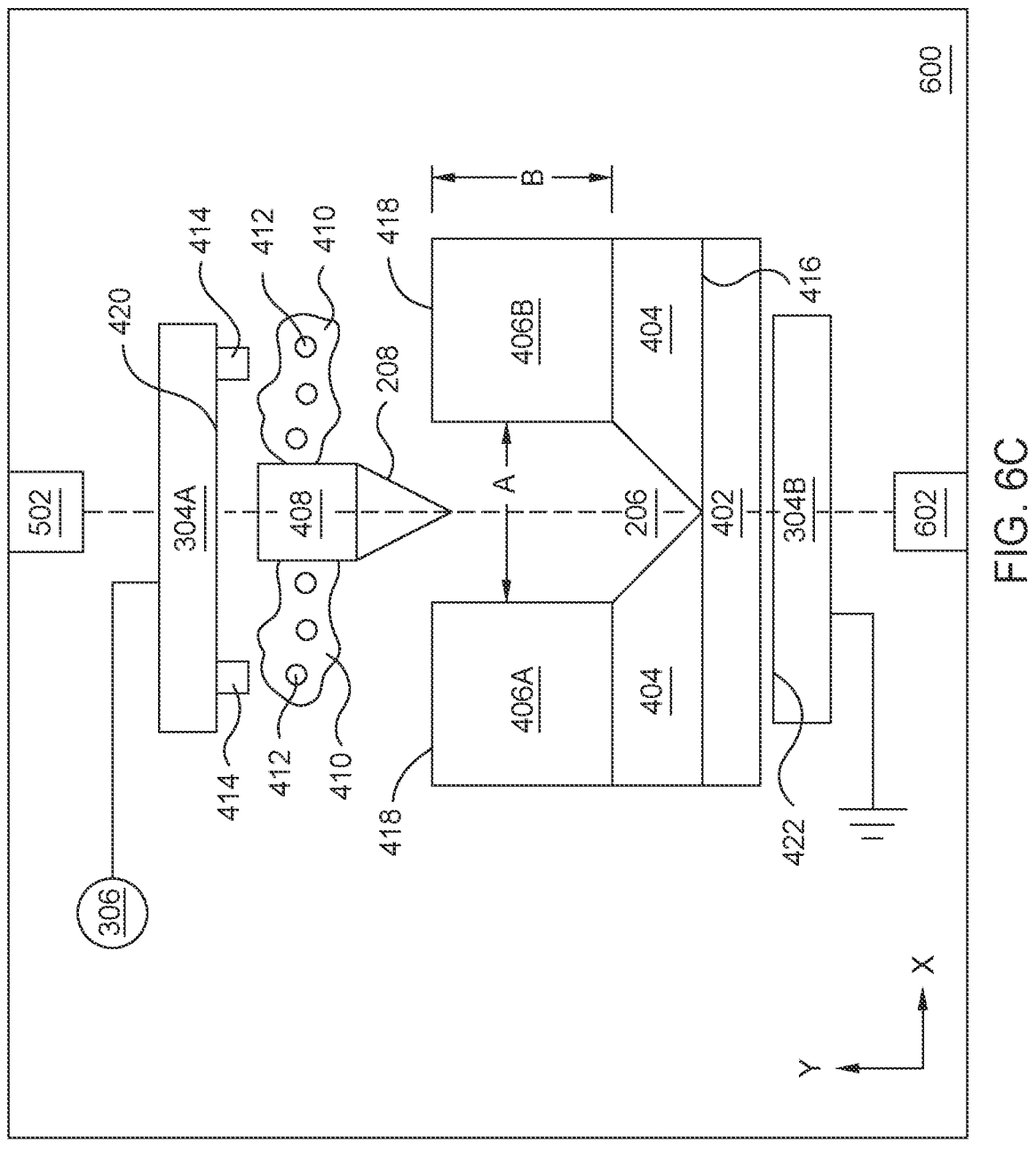

FIGS. 6A-6C are schematic illustrations of electrode, vacuum port, and blower orientation relative to substrate location in a laser cutting chamber 600 according to various embodiments. FIGS. 6A-6C are identical to FIGS. 5A-5C except that a blower 602 has been added to FIGS. 6A-6C. The blower 602 is a location where either a blowing mechanism such as a fan is disposed or an opening in the chamber 600 through which a gas is delivered into the chamber 600 by a mechanism disposed outside of the chamber body. The blower 602 is strategically located to be aligned with the second electrode 304B such that the gas is directed towards the first electrode 304A. In so doing, gas being directed across the chamber 600 will be pushed out of the trench 206 as will, ideally, the electrons 412. FIG. 6A shows the blower 602 and the surface 420 of the first electrode 304A disposed at about 90 degrees from the surface 416 of the substrate support 402. FIG. 6B shows the blower 602 and the surface 420 of the first electrode 304A disposed at about 45 degrees from the surface 416 of the substrate support 402. FIG. 6C shows the blower 602 and the surface 420 of the first electrode 304A disposed at about 0 degrees from the surface 416 of the substrate support 402.

It is to be understood that while the vacuum port 502 is shown to be aligned with the first electrode 304A, it is contemplated that the vacuum port 502 may be at other locations as well so long as the vacuum port 502 functions to draw electrons out of the trench 206 and away from the surface 418. It is also contemplated that the chamber 600 will be drawn to a vacuum level of −20 kPa to about −40 kPa. Furthermore, it is to be understood that while the blower 602 is shown to be aligned with the second electrode 304B, it is contemplated that the blower 602 may be at other locations as well so long as the blower 602 functions to push electrons out of the trench 206 and away from the surface 418. While the blower 602 is shown in use with both the first electrode 304A and the vacuum port 502, it is contemplated that the blower 602 may function without the vacuum port 502 so long as there is some manner for gas directed by the blower 602 to leave the chamber 600 rather than simply be circulated about the chamber 600.

Figure 7:
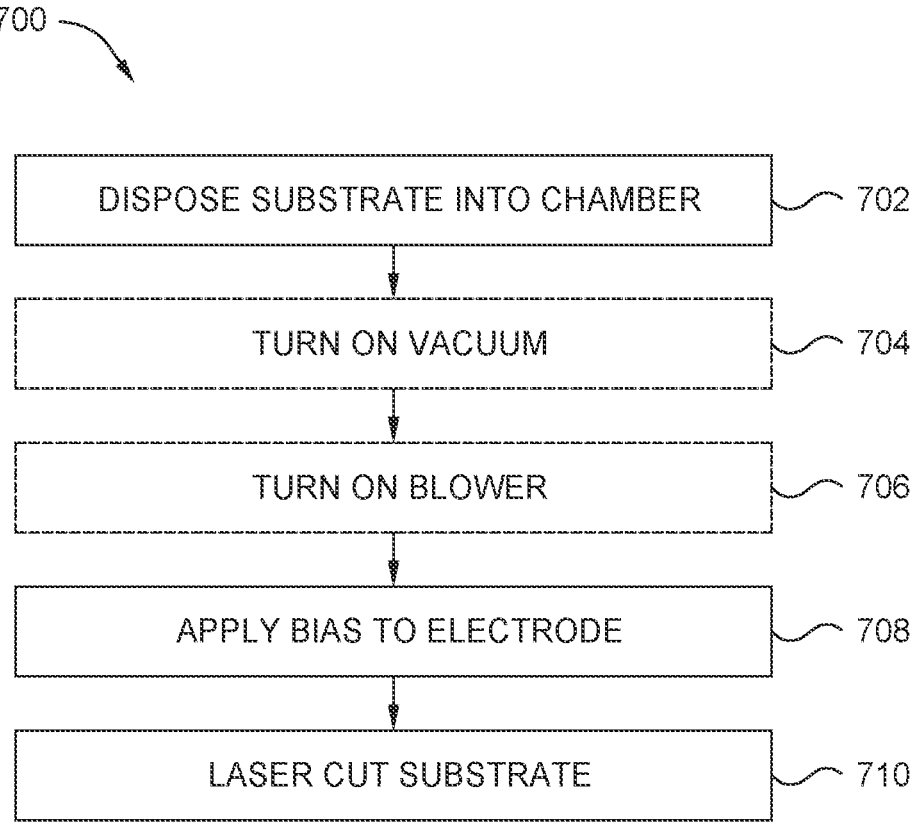
FIG. 7 is a flowchart illustrating a method of laser cutting according to one embodiment.

FIG. 7 is a flowchart illustrating a method 700 of laser cutting according to one embodiment. Initially, at 702, a substrate is disposed into a laser cutting chamber. A vacuum may then optionally be drawn at 704 by turning on a vacuum pump. Additionally, gas may be pushed through the chamber at 706 by optionally turning on a blower. While 704 and 706 are optional, 704, 706, and 708 may also occur in any order. A bias is applied to an electrode at 708 to draw electrons thereto during the laser cutting process. The substrate is then laser cut at 710.

By utilizing at least one electrode, an electron cloud or plasma plume or cloud can be directed away from the cutting area where a laser cuts a wafer. In so doing, less material deposits onto the substrate during the laser cutting. With less material redepositing onto the substrate, the laser cutting time can be reduced. In addition to the electrode, a vacuum pump and/or blower may be used to enhance movement of the electron cloud or plasma away from the substrate. The electric field will reduce the laser pass count for laser cutting the substrate. Additionally, due to the plasma plume having a lower electron density, the laser energy will not be impacted. Less particles will accumulate on the substrate for better quality. Additionally, by utilizing at least one electrode, there is a laser energy savings due to pulling electrons away from the trench that will thus increase the laser cutting efficiency.

In one embodiment, a processing chamber comprises: a substrate support having a surface upon which a hypothetical substrate is to be disposed during processing; a laser source; a first electrode coupled to a power source; and a second electrode coupled to ground, wherein the first electrode and the second electrode are disposed in the processing chamber such that the hypothetical substrate will be disposed between the first electrode and the second electrode, wherein a center of the first electrode is linearly aligned with at least a portion of the second electrode and the hypothetical substrate. The process chamber further comprises at least one electron density sensor coupled to the first electrode. A surface of the first electrode that is facing the hypothetical substrate is disposed at an angle of between 0 degrees and 90 degrees relative to the surface of the substrate support. At least a portion of the second electrode is disposed below the substrate support. The processing chamber further comprises at least one vacuum port linearly aligned with the first electrode. The at least one vacuum port is disposed at an angle relative to the surface, wherein the angle is between 0 degrees and 90 degrees. The processing chamber further comprises at least one blower linearly aligned with the second electrode. The at least one blower is disposed at an angle relative to the surface to cause electrons to be directed towards the first electrode. The power source is a DC power source. The power source is an AC power source and wherein a surface of the first electrode that is facing the hypothetical substrate is disposed at an angle of between 45 degrees and 90 degrees relative to the surface of the substrate support.

In another embodiment, a processing chamber comprises: a substrate support configured to support a hypothetical substrate; a laser source; and means for directing electrons emitted from the hypothetical substrate away from the hypothetical substrate, wherein the means for directing directs the electrons in a predetermined direction. The processing chamber further comprises a power source coupled to the means for directing electrons. At least a portion of the means for directing electrons is grounded.

In another embodiment, a method comprises: disposing a substrate in a processing chamber on a surface of a substrate support; laser cutting the substrate; and directing electrons emitted during the laser cutting to a first electrode disposed in the processing chamber, wherein the directing comprises applying a bias to the first electrode and maintaining a second electrode at ground, wherein the second electrode is opposite to the first electrode. The method further comprises evacuating the processing chamber. Applying the bias creates an electric field direction, wherein evacuating the processing chamber creates a vacuum direction, and wherein the electric field direction and the vacuum direction are parallel. The method further comprises directing gas from the second electrode to the first electrode during the laser cutting. Applying the bias creates an electric field direction, wherein directing gas from the second electrode to the first electrode creates a gas flow direction, and wherein the electric field direction and the gas flow direction are parallel. Directing the electrons results in an uneven plasma plume, wherein a greater percentage of the plasma plume is disposed adjacent the first electrode as compared to the second electrode. The directing comprises directing electrons in a direction perpendicular to the surface.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
disposing a substrate in a processing chamber on a surface of a substrate support, wherein the chamber includes a laser source inside the chamber;
laser cutting the substrate; and
directing electrons emitted during the laser cutting to a first electrode disposed in the processing chamber, wherein the directing comprises applying a bias to the first electrode and maintaining a second electrode at ground, wherein the second electrode is opposite to the first electrode, wherein the first electrode is powered and the second electrode is grounded, wherein the second electrode is coupled to ground, and wherein at least one electron density sensor is coupled to the first electrode.

2. The method of claim 1, further comprising evacuating the processing chamber.

3. The method of claim 2, wherein applying the bias creates an electric field direction, wherein evacuating the processing chamber creates a vacuum direction, and wherein the electric field direction and the vacuum direction are parallel.

4. The method of claim 1, further comprising directing gas from the second electrode to the first electrode during the laser cutting.

5. The method of claim 4, wherein applying the bias creates an electric field direction, wherein directing gas from the second electrode to the first electrode creates a gas flow direction, and wherein the electric field direction and the gas flow direction are parallel.

6. The method of claim 1, wherein directing the electrons results in an uneven plasma plume, wherein a greater percentage of the plasma plume is disposed adjacent the first electrode as compared to the second electrode.

7. The method of claim 1, wherein the directing comprises directing electrons in a direction perpendicular to the surface.

8. The method of claim 1, further comprising turning on a blower to push gas through the chamber.

9. The method of claim 1, wherein the surfaces of the first electrode and the second electrode that face the substrate are parallel to one another.

10. The method of claim 9, wherein the surfaces are perpendicular to a surface of the substrate.

11. The method of claim 9, wherein the surfaces are at an angle of 45 degrees relative to a surface of the substrate.

12. The method of claim 9, wherein the surfaces are at an angle of 0 degrees relative to a surface of the substrate.

13. The method of claim 1, wherein the chamber has a vacuum port aligned with the first electrode such that the vacuum is drawn towards the first electrode.

14. The method of claim 1, wherein the chamber has a blower disposed at a location aligned with the second electrode such that gas is directed towards the first electrode.

15. The method of claim 1, wherein a center of the first electrode is linearly aligned with at least a portion of the second electrode and the substrate.

16. The method of claim 1, wherein a surface of the first electrode that is facing the substrate is disposed at an angle of between 0 degrees and 90 degrees relative to the surface of the substrate support.

17. The method of claim 16, wherein at least a portion of the second electrode is disposed below the substrate support.

18. The method of claim 1, wherein the chamber comprises at least one vacuum port that is disposed at an angle relative to the surface, wherein the angle is between 0 degrees and 90 degrees.

19. The method of claim 1, further comprising at least one blower linearly aligned with the second electrode, wherein the at least one blower is disposed at an angle relative to the surface to cause electrons to be directed towards the first electrode.

20. The method of claim 1, wherein the bias applied is from a DC power source.

* * * * *